United States Patent
Yaacobi-Gross et al.

(10) Patent No.: US 11,968,885 B2
(45) Date of Patent: Apr. 23, 2024

(54) ORGANIC PHOTODETECTOR

(71) Applicant: Sumitomo Chemical Company Limited, Tokyo (JP)

(72) Inventors: Nir Yaacobi-Gross, Cambridgeshire (GB); Michael Mellor, Godmanchester (GB); Ken Ominiabohs, Godmanchester (GB)

(73) Assignee: Sumitomo Chemical Company Limited, Tokyo (JP)

( * ) Notice: Subject to any disclaimer, the term of this patent is extended or adjusted under 35 U.S.C. 154(b) by 657 days.

(21) Appl. No.: 17/258,041

(22) PCT Filed: Jul. 2, 2019

(86) PCT No.: PCT/GB2019/051876
§ 371 (c)(1),
(2) Date: Jan. 5, 2021

(87) PCT Pub. No.: WO2020/008186
PCT Pub. Date: Jan. 9, 2020

(65) Prior Publication Data
US 2021/0280805 A1    Sep. 9, 2021

(30) Foreign Application Priority Data
Jul. 6, 2018 (GB) ................................. 1811173

(51) Int. Cl.
*H10K 85/30* (2023.01)
*H10K 85/10* (2023.01)
*H10K 30/30* (2023.01)
*H10K 30/82* (2023.01)
(Continued)

(52) U.S. Cl.
CPC ....... *H10K 85/371* (2023.02); *H10K 85/1135* (2023.02); *H10K 85/151* (2023.02);
(Continued)

(58) Field of Classification Search
CPC ............ H10K 85/371; H10K 85/1135; H10K 85/151; H10K 30/353; H10K 30/82;
(Continued)

(56) References Cited

U.S. PATENT DOCUMENTS

| 2013/0056070 A1 | 3/2013 | Horng et al. |
| 2016/0267337 A1* | 9/2016 | Bofinger .............. H10K 30/353 |
| 2019/0051830 A1* | 2/2019 | Druffel ................ H10K 30/151 |

FOREIGN PATENT DOCUMENTS

| CN | 106654020 A | 5/2017 |
| EP | 3 125 323 A1 | 2/2017 |

(Continued)

OTHER PUBLICATIONS

Fang et al. ("Large Gain, Low Noise Nanocomposite Ultraviolet Photodetctors with a Linear Dynamic Range of 120dB," Adv. Optical Mater. 2, pp. 348-353, 2014) (Year: 2014).*
(Continued)

*Primary Examiner* — Yasser A Abdelaziez
(74) *Attorney, Agent, or Firm* — Wolf, Greenfield & Sacks, P.C.

(57) ABSTRACT

An organic photodetector including an electron blocking layer, where the electron blocking layer prevents and/or reduces dark current by preventing electrons traveling from the organic photodetector's anode to the organic photodetector's photoactive layer during dark, photon-less conditions. The electron blocking layer is formed from a compound having the formula: $[M]^{a+}[X]_a{-}$ (General Formula (I)) where: M is a metal; X is CN, SCN, Se CN or TeCN; and a is at least 1.

18 Claims, 2 Drawing Sheets

(51) Int. Cl.
   *H10K 71/15* (2023.01)
   *H10K 71/40* (2023.01)
(52) U.S. Cl.
   CPC ............ *H10K 30/353* (2023.02); *H10K 30/82* (2023.02); *H10K 71/15* (2023.02); *H10K 71/441* (2023.02)
(58) Field of Classification Search
   CPC ...... H10K 71/15; H10K 71/441; H10K 39/10; H10K 30/00; H10K 30/30; Y02E 10/549; Y02P 70/50
   See application file for complete search history.

(56) References Cited

FOREIGN PATENT DOCUMENTS

| | | |
|---|---|---|
| GB | 1811173.2 | 1/2019 |
| WO | WO 2012/106119 A1 | 8/2012 |
| WO | PCT/GB2019/051876 | 9/2019 |

OTHER PUBLICATIONS

Combined Search and Examination Report dated Jan. 28, 2019 in connection with GB Application No. 1811173.2.
International Search Report and Written Opinion dated Sep. 3, 2019 in connection with International Application No. PCT/GB2019/051876.
Treat et al., Copper thiocyanate: An attractive hole transport/extraction layer for use in organic photovoltaic cells. Applied Physics Letters. Jul. 6, 2015;107:013301. 6 pages.

\* cited by examiner

ORGANIC PHOTODETECTOR

RELATED APPLICATIONS

This Application is a national stage filing under 35 U.S.C. § 371 of international PCT application no. PCT/GB2019/051876, filed Jul. 2, 2019, which claims priority to United Kingdom patent application no. GB 1811173.2, filed Jul. 6, 2018, each of which is incorporated herein by reference in its entirety.

BACKGROUND

The disclosure relates to organic photodetectors and more particularly to electron blocking layers for organic photodetectors.

Organic electronic devices comprise organic semiconductor materials, and such devices include organic light-emitting devices, organic field effect transistors, organic photovoltaic devices and organic photodetectors (OPDs).

U.S. Pat. No. 9,685,567 describes a nanocomposite OPD, where an active layer includes a nanocomposite material that has a polymer blended with nanoparticles or organic electron trapping particles. The photodetector described OPD has a low dark current when not illuminated by light and has a high conductivity when illuminated by light, in which the light passes the anode and is absorbed by the active layer.

U.S. Pat. No. 9,391,287 describes an organic semiconductor device that includes a perovskite layer formed using a solution process with lead (II) iodide and methyl ammonium halide and a method for fabrication of the semiconductor device. The organic semiconductor device may be used in photovoltaic devices.

U.S. Pat. No. 9,508,945 describes spectrally tuneable broadband organic photodetectors and methods of making the same.

U.S. Pat. No. 7,816,715 is directed to organic photosensitive optoelectronic devices having increased efficiency.

Japanese Patent No. 05349156 relates to an organic photosensitive optoelectronic device.

Treat, N. D. et al., Appl. Phys. Lett., 107, 1 relates to the properties of the inorganic molecular semiconductor copper (I) thiocyanate (CUSCN) for use as a hole collection/transport later (HTL) in organic photovoltaic (OPV) cells.

Chaudhary, N. et al., Opt. Mater., 69, 367 discloses the use of dimethyl sulfoxide (DMSO) for solution processed thin film deposition of CUSCN as a hole transporting layer in organic solar cells.

Wijeyasinghe et al., Adv. Funct. Mater., 27, 25 reports the development of copper(I) thiocyanate (CuSCN) hole-transport layers (HTLs) processed from aqueous ammonia as a novel alternative to conventional n-alkyl sulfide solvents.

SUMMARY

A summary of aspects of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

In many OPDs, dark current, which is the term used for current flowing through the OPD in the absence of any photons being incident on the OPD, may affect the limit of photon detection of the OPD. To reduce dark current, a layer of material may be incorporated into an OPD, where the layer is configured to inhibit the transfer of electrons from the anode to the photoactive layer during dark, photon-less conditions. Such layers are commonly referred to as electron blocking layers since the layer reduces the dark current by "blocking" electrons from travelling from the anode to the photoactive layer during dark conditions. However, forming an electron blocking layer in the OPD may be problematic, for example solution processing of an electron blocking layer directly onto a photoactive layer of the OPD, a common way of applying the EBL to the OPD's photoactive layer, may dissolve the photoactive layer.

The design considerations for an OPD differ from those for a solar cell (e.g. organic photovoltaics OPVs). Whilst high power conversion efficiency is the main focus for solar cells, one key focus in the design of photodetectors is reducing the dark current. By reducing the dark current, the specific detectivity may be increased. Preferably, the dark current is decreased without compromising the responsivity and/or EQE of the device. In addition, solar cells usually require a relatively broad spectral response at wavelengths where most of the sun irradiance lays (e.g. X, <900 nm). Photodetectors, on the other hand, usually operate in a specific narrow spectral band, which may be dependent upon a specific application. For example, the OPDs described herein may be suitable for the detection of light in the NIR regions of the electromagnetic spectrum, where irradiance from the sun is depleted (e.g. >940 nm, 1150 nm, or 1400 nm).

The present inventors have found that metal cyanide, metal thiocyanate, metal selenocyanate (comprising a SeCN anion) and metal tellurocyanate (comprising a TeCN anion) compounds can be integrated into and used as electron blocking compounds in OPDs to reduce dark current. Further, the inventors have found that these compounds can be deposited using solution processing methods directly onto a photoactive layer.

In some embodiments of the present disclosure, an organic photodetector is described that includes a substrate, a cathode disposed on a surface of the substrate, and an anode, with a photoactive layer comprising an organic electron donor and an organic electron acceptor disposed between the anode and the cathode. An electron blocking layer is disposed between the photoactive layer and the anode. In some embodiments of the present disclosure, the electron blocking layer comprises an electron blocking compound having General Formula (I):

$$[M]^{a+}[X]_a^- \qquad \text{(General Formula (I))}$$

where, M is a metal; X is a cyano group (CN), a thiocyano group (SCN), selenocyanate (SeCN) or tellurocyanate TeCN; and a is at least 1. The inventors have found that electron blocking layers having General Formula (I) can be integrated into an OPD between the photoactive layer and the anode, and this integration can be achieved using solution processing methods to deposit the electron blocking layer directly onto the photoactive layer.

In some embodiments, an organic photodetector with an electron blocking layer may be produced by depositing a formulation of an organic electron donor and an organic electron acceptor dissolved or dispersed in a first solvent over a cathode on a substrate to form a wet film. In some embodiments, the wet film may be dried to provide a photoactive layer comprising the organic electron donor and the organic electron acceptor. In some embodiments, a second formulation of the electron blocking compound dissolved in a solvent may be deposited onto the photoactive layer to form a wet film. In some embodiments, this wet film may be dried to provide the electron blocking layer on the photoactive layer. In some embodiments, an anode may be formed over the electron blocking layer.

In some embodiments, the OPD with an electron blocking layer, in accordance with some embodiments of the present disclosure, may be connected to a voltage source such that a reverse bias may be applied to the OPD to reduce the dark current.

DESCRIPTION OF DRAWINGS

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

The drawings are not drawn to scale and have various viewpoints and perspectives. The drawings are some implementations and examples. Additionally, some components and/or operations may be separated into different blocks or combined into a single block for the purposes of discussion of some of the embodiments of the disclosed technology. Moreover, while the technology is amenable to various modifications and alternative forms, specific embodiments have been shown by way of example in the drawings and are described in detail below. The intention, however, is not to limit the technology to the particular implementations described. On the contrary, the technology is intended to cover all modifications, equivalents, and alternatives falling within the scope of the technology as defined by the appended claims.

DETAILED DESCRIPTION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or," in reference to a list of two or more items, covers all of the following interpretations of the word: any of the items in the list, all of the items in the list, and any combination of the items in the list.

The teachings of the technology provided herein can be applied to other systems, not necessarily the system described below. The elements and acts of the various examples described below can be combined to provide further implementations of the technology. Some alternative implementations of the technology may include not only additional elements to those implementations noted below, but also may include fewer elements.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the following description, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

Figure 1:
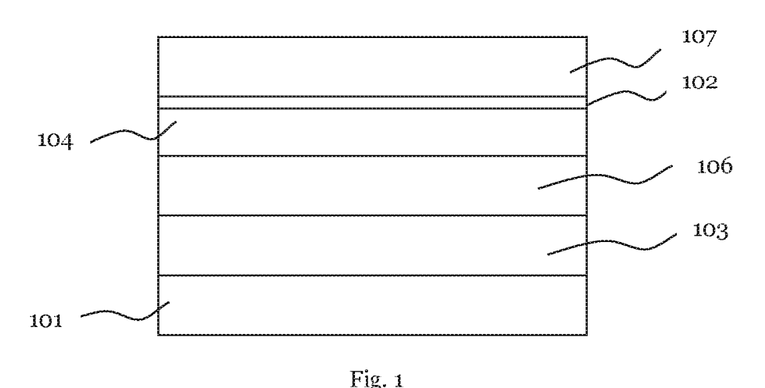
FIG. 1 illustrates an organic photodetector, according to some embodiments of the present disclosure.

FIG. 1 illustrates an OPD according to some embodiments of the present disclosure. The OPD comprises a cathode 103 supported by/coupled with a substrate 101, an anode 107 and a bulk heterojunction layer 104 located between the anode 107 and the cathode 103 comprising a mixture of an organic electron acceptor and an organic electron donor. Optionally, the bulk heterojunction layer 104 may consist of the electron acceptor and the electron donor. Disposed between the bulk heterojunction layer 104 and the anode is an electron blocking layer 102. In some embodiments, the OPD comprises a layer of material 106 that modifies the work function of the cathode 103. In other embodiments, this layer may or may not be present. In some embodiments, the electron blocking layer 102 is in direct contact with the anode 107 and the bulk heterojunction layer 104.

The OPD may comprise other layers not shown in FIG. 1. For example, the OPD may comprise a hole transport layer (HTL) located between the anode 107 and the bulk heterojunction layer 104.

In some embodiments, the bulk heterojunction layer may have a thickness in the range of about 50-3000 nm, or, preferably between about 300-1500 nm.

In some embodiments, the photoactive layer may have a substantially uniform ratio of electron acceptor and electron donor throughout the thickness of the photoactive layer or the ratio thereof may vary gradually or stepwise throughout the thickness of the photoactive bulk heterojunction layer.

In some embodiments, the anode 107 and the cathode 103 may be connected to circuitry (not shown), which may include a voltage source for applying a reverse bias to the device and a detector (e.g. a current meter and readout device, wired in series with the reverse bias voltage source, as detection circuit), for example, to measure the generated photocurrent. Conversion of light incident on the bulk heterojunction layer into electrical current may be detected in reverse bias mode. In some embodiments, the photodetectors are part of a system comprising a plurality of photodetectors. For example, the photodetectors may be part of an array in an image sensor of a camera. The voltage applied to the photodetectors may be varied. In some embodiments, the photodetectors may be continuously biased when in use.

In some embodiments, the OPD may be incorporated into a sensor comprising a light source and the OPD may be configured to receive light emitted from the light source. In some embodiments, the light from the light source may or may not be changed before reaching the light source. For example, the light may be filtered, down-converted or up-converted before it reaches the light source.

A high dark current in photodetectors may limit the detectible optical input signal due to a low signal-to-noise ratio.

In some embodiments, electron blocking layer 102 comprises or consists of a metal compound having at least one CN, SCN, SeCN or TeCN anion. The inventors have found that such compounds can inhibit the transfer of electrons from the anode to the photoactive layer in dark conditions, thereby reducing dark current.

In some embodiments, the electron blocking layer has a lowest unoccupied molecular orbital (LUMO) that is shallower than the LUMO of the organic electron acceptor. Without wishing to be bound by theory, it is thought that the relatively shallow LUMO of the electron blocking layer provides an energy barrier to electron transfer from the anode to the organic electron acceptor during dark conditions. Reference to a "deeper" energy level as used herein means further from vacuum level and reference to a "shallower" energy level as used herein means closer to vacuum level.

In some embodiments, the electron blocking layer may have a wider band gap than the gap between the highest occupied molecular orbital (HOMO) of the organic electron donor and the LUMO of the organic electron acceptor.

In some embodiments of the present disclosure, the electron blocking layer may have a band-gap of between about 2 eV and about 4.5 eV.

In some embodiments of the present disclosure, the electron-blocking layer may be transparent to visible light, thereby allowing light to pass through the electron blocking layer and reach the photoactive layer. In some embodiments, the electron blocking layer has a transmittance of at least 70%, optionally at least 80%, to all wavelengths in the range of 300-900 nm. In some embodiments, the electron blocking layer has a transmittance of at least 90% to all wavelengths in the range of 450-1400 nm. In some embodiments, the electron blocking layer has a transmittance of at least 90% to all wavelengths above 1400 nm. In some embodiments, the electron blocking layer has a transmittance of at least 85% to all wavelengths in the range of 400-450 nm.

In some embodiments of the present disclosure, the electron blocking compound has General Formula (I):

$$[M]^{a+}[X]_a^-$$

where: M is a metal; a is at least 1; and X is CN, SCN, SeCN or TeCN. In some embodiments, a is 1, 2 or 3.

In some embodiments the metal is selected from any metal in Group IA, IIA, IIIB, IVB, VB, VIB, VIIB, VIIIB, IB, IIB, IIIA, IVA, VA or VIA of the Periodic Table. In some embodiments, M is selected from the group consisting of: Cu, Se, Te, Au, Ag, K, Na and Ba. In some embodiments, M is Cu and a is 1. In some embodiments, M is Ag and a is 1. In some embodiments, M is Au and a is 1.

In some embodiments of the present disclosure, the electron blocking compound is selected from the group consisting of: copper thiocyanate, selenium cyanide, tellurium dicyanide, potassium thiocyanate, sodium thiocyanate, a metal tellurocyanate, a metal selenocyanate and barium thiocyanate. In some embodiments, the electron blocking compound comprises copper thiocyanate. In some embodiments, a is 1, 2 or 3.

In some embodiments of the present disclosure, the electron blocking layer comprises a thickness in the range of between about 5 to 50 nm, 5 to 40 nm, 5 to 30 nm, 5 to 20 nm or 5 to 10 nm. In some embodiments, the electron blocking layer has a thickness in the range of between about 5 to 30 nm. In some embodiments, the electron blocking layer has a thickness of 5 nm or 15 nm. The thickness of the electron blocking layer may be selected such that it has a desired transparency to the desired wavelengths of light whilst at the same time maintaining its ability to block electron movement between the anode and the bulk heterojunction layer during dark conditions.

It will be understood that the organic electron donor of the bulk heterojunction layer may be a single electron donor material or a mixture of two or more electron donor materials, and the organic electron acceptor may consist of a single electron acceptor material or may be a mixture of two or more electron acceptor materials.

The electron acceptor and the electron donor may each independently be a polymeric material or a non-polymeric material.

The organic electron donor compound (p-type) is not particularly limited and may be appropriately selected from electron donating materials that are known to the person skilled in the art, including organic polymers, oligomers and small molecules.

The electron donor material has a LUMO that is shallower than the LUMO of the electron acceptor material. In some embodiments, the gap between the LUMO acceptor and the LUMO donor is at least 0.1 eV.

In some embodiments of the present disclosure, the electron donor material has a LUMO of up to 3.5 eV from vacuum level, optionally 3.0-3.5 eV from vacuum level.

In some embodiments of the present disclosure, the electron donor material has a HOMO level of no more than 5.5 eV from vacuum level.

In some embodiments, the donor compound may comprise a semiconducting polymer.

In some embodiments, the p-type donor compound comprises an organic conjugated polymer, which can be a homopolymer or copolymer including alternating, random or block copolymers. In some embodiments of the present disclosure, the p-type donor compound comprises non-crystalline or semi-crystalline conjugated organic polymers. In some embodiments, the p-type organic semiconductor is a conjugated organic polymer with a low bandgap, typically between 2.5 eV and 1.5 eV, preferably between 2.3 eV and 1.8 eV.

As exemplary p-type donor polymers, polymers selected from conjugated hydrocarbon or heterocyclic polymers including polyacene, polyaniline, polyazulene, polybenzofuran, polyfluorene, polyfuran, polyindenofluorene, polyindole, polyphenylene, polypyrazoline, polypyrene, polypyridazine, polypyridine, polytriarylamine, poly(phenylene vinylene), poly(3-substituted thiophene), poly(3,4-bisubstituted thiophene), polyselenophene, poly(3-substituted selenophene), poly(3,4-bisubstituted selenophene), poly(bis-thiophene), poly(terthiophene), poly(bisselenophene), poly (terselenophene), polythieno [2,3-b]thiophene, polythieno [3,2-b]thiophene, polybenzothiophene, polybenzo [1,2-b:4,5-b']dithiophene, polyisothianaphthene, poly(monosubstituted pyrrole), poly(3,4-bisubstituted pyrrole), poly-1,3,4-oxadiazoles, polyisothianaphthene, derivatives and co-polymers thereof may be mentioned In some embodiments of the present disclosure, the p-type donors comprise copolymers of polyfluorenes and polythiophenes, each of which may be substituted, and polymers comprising benzothiadiazole-based and thiophene-based repeating units, each of which may be substituted. It is understood that the p-type donor may also consist of a mixture of a plurality of electron donating materials.

The p-type conjugated polymer may comprises a repeat unit of formula (II):

(II)

wherein $R^3$ in each occurrence is independently H or a substituent.

Optionally, each $R^3$ is independently selected from the group consisting of $C_{1-20}$ alkyl wherein one or more non-adjacent, non-terminal carbon atoms of the alkyl group may be replaced with O, S or C=O and wherein one or more H atoms of the $C_{1-20}$ alkyl may be replaced with F; an aryl or heteroaryl group, such as phenyl, which may be unsubstituted or substituted with one or more substituents; and fluorine.

Substituents of an aryl or heteroaryl group are optionally selected from F, CN, $NO_2$ and $C_{1-20}$ alkyl wherein one or more non-adjacent, non-terminal carbon atoms of the alkyl group may be replaced with O, S or C=O.

By "non-terminal" as used herein is meant a carbon atom other than the methyl group of a linear alkyl (n-alkyl) chain and the methyl groups of a branched alkyl chain.

In some embodiments, each $R^3$ is fluorine.

A polymer comprising a repeat unit of formula (I) may comprise a copolymer comprising one or more co-repeat units. The one or more co-repeat units may comprise or consist of one or more of $C_{6-20}$ monocyclic or polycyclic arylene repeat units which may be unsubstituted or substituted with one or more substituents; 5-20 membered monocyclic or polycyclic heteroarylene repeat units which may be unsubstituted or substituted with one or more substituents.

The one or more co-repeat units may have formula (III):

(III)

wherein $Ar^1$ in each occurrence is an arylene group or a heteroarylene group; x is at least 1; $R^{17}$ in each occurrence is independently a substituent; y independently in each occurrence is 0 or a positive integer, optionally 0, 1, 2, 3 or 4; and two groups $R^{17}$ may be linked to form a ring.

Optionally, each $R^{17}$ is independently selected from the group consisting of a linear, branched or cyclic $C_{1-20}$ alkyl wherein one or more non-adjacent, non-terminal C atoms of the $C_{1-20}$ alkyl may be replaced with O, S, COO or CO.

Two groups $R^{17}$ may be linked to form a $C_{1-10}$ alkylene group wherein one or more non-adjacent C atoms of the alkylene group may be replaced with O, S, COO or CO.

In some embodiments, x is 2.

In some embodiments, each $Ar^1$ is independently a 5 or 6 membered heteroarylene group, optionally a heteroarylene group selected from the group consisting of thiophene, furan, selenophene, pyrrole, diazole, triazole, pyridine, diazine and triazine, preferably thiophene.

Optionally, the repeat unit of formula (III) has formula (IV):

(IV)

Optionally, the groups $R^{17}$ are linked to form a 2-5 membered bridging group. Optionally, the bridging group has formula —O—C($R^{18}$)$_2$— wherein $R^{18}$ in each occurrence is independently H or a substituent. Substituents $R^{18}$ are optionally selected from $C_{1-20}$ alkyl. In some embodiments, each $R^{18}$ is H.

In some embodiments, the donor has the structure:

In some embodiments of the present disclosure, the electron acceptor is a non-polymeric compound, and may comprise a fullerene or a small molecule non-fullerene acceptor. Surprisingly, where the photoactive layer comprises an acceptor that is a fullerene acceptor, it has been found that, by depositing the electron blocking layer from a solution of aqueous ammonia onto the photoactive layer, dissolution of the underlying photoactive layer is avoided.

Suitable fullerene acceptors may comprise a $C_{60}$, $C_{70}$, $C_{76}$, $C_{78}$ and $C_{84}$ fullerene or a derivative thereof including, without limitation, PCBM-type fullerene derivatives (including phenyl-C61-butyric acid methyl ester ($C_{60}$PCBM and his-PCBM (a $C_{60}$ derivative)), TCBM-type fullerene derivatives (e.g. tolyl-C61-butyric acid methyl ester ($C_{60}$TCBM)), IPH-type fullerene derivatives (e.g. $C_{70}$-IPH), IPB-type fullerene derivatives (e.g. $C_{70}$-IPB), ICBA-type fullerene derivatives (including ICBA (an indene $C_{60}$ bisadduct) and ThCBM-type fullerene derivatives (e.g. thienyl-C61-butyric acid methyl ester ($C_{60}$ThCBM).

Fullerene derivatives may have formula (V):

(V)

wherein A, together with the C—C group of the fullerene, forms a monocyclic or fused ring group, which may be unsubstituted or substituted with one or more substituents.

Exemplary fullerene derivatives include formulae (Va), (Vb) and (Vc):

(Va)

-continued (Vb)

(Vc)

wherein $R^4$-$R^{15}$ are each independently H or a substituent.

Substituents $R^4$-$R^{15}$ are optionally and independently in each occurrence selected from the group consisting of aryl or heteroaryl, optionally phenyl, which may be unsubstituted or substituted with one or more substituents; and $C_{1-20}$ alkyl wherein one or more non-adjacent, non-terminal C atoms may be replaced with O, S, CO or COO and one or more H atoms may be replaced with F.

Substituents of aryl or heteroaryl, where present, are optionally selected from $C_{1-12}$ alkyl wherein one or more non-adjacent, non-terminal C atoms may be replaced with O, S, CO or COO and one or more H atoms may be replaced with F.

As further examples of fullerene derivatives, those disclosed in WO 2004/073082 A1, U.S. Patent Pub. No. 2011/0132439A1, WO 2015/036075A1, and U.S. Patent Pub. No. 2011/0132439 A1 may be mentioned, the contents of which are incorporated herein by reference for all purposes.

Optionally, the electron acceptor material has a LUMO level more than about 3.5 eV from vacuum level, and optionally about 3.6-4.0 eV from vacuum level.

In some embodiments of the present disclosure, the LUMO of the electron acceptor is at least about 1.2 eV, and optionally at least about 1.4 eV closer to vacuum than the work function of the anode HOMO and LUMO levels as described herein may be measured by square wave voltammetry.

In square wave voltammetry, the current at a working electrode is measured while the potential between the working electrode and a reference electrode is swept linearly in time. The difference current between a forward and reverse pulse is plotted as a function of potential to yield a voltammogram.

The apparatus to measure HOMO or LUMO energy levels by SWV may comprise a cell containing tertiary butyl ammonium perchlorate or tertiary butyl ammonium hexafluorophosphate in acetonitrile; a glassy carbon working electrode; a platinum counter electrode and a leak free Ag/AgCl reference electrode. Ferrocene is added directly to the existing cell at the end of the experiment for calculation purposes where the potentials are determined for the oxidation and reduction of ferrocene versus Ag/AgCl using cyclic voltammetry (CV).

In some embodiments, the weight ratio of the donor compound to the acceptor compound is about 1:0.5, 1:0.6, 1:0.7, 1:0.8, 1:0.9, 1:1, 1:1.1, 1:1.2, 1:1.3, 1:1.4, 1:1.5, 1:1.6, 1:1.7, 1:1.8, 1:1.9 or 1:2.

In some embodiments, the weight of the donor compound to the acceptor compound is from about 1:0.5 to about 1:2.

In some embodiments of the present disclosure, the weight ratio of the donor compound to the acceptor compound is about 1:1, about 1:1.1, about 1:1.2, about 1:1.3, about 1:1.4, about 1:1.5, about 1:1.6, about 1:1.7, about 1:1.8, about 1:1.9 or about 1:2. In some embodiments, the weight ratio of the donor compound to the acceptor compound is about 1:1.7.

In some embodiments, the anode and cathode each independently comprise or consists of at least one conductive layer. Exemplary conductive materials for include, without limitation, metals, conducting metal oxides and conducting polymers.

At least one of the anode and cathode is transparent so that light incident on the device may reach the bulk heterojunction layer. The or each transparent electrode preferably has a transmittance of at least 70%, optionally at least 80%, to wavelengths in the range of 300-900 nm. In some embodiments, the anode comprises a conducting polymer, more such as poly(3,4-ethylenedioxythiophene) (PEDOT) with a polyanion, optionally polystyrene sulfonate (PSS).

If in use the OPD is configured to detect light incident on the anode then any encapsulation over the anode is transparent. Optionally, the cathode comprises or consists of a layer of transparent conducting oxide, such as indium tin oxide or indium zinc oxide. A cathode modification layer, optionally a layer of polyethyleneimine (PEIE) is provided between the cathode and the bulk heterojunction layer.

If in use the OPD is configured to detect light incident on the cathode then the substrate is transparent. The device may be formed by forming the bulk heterojunction layer over the cathode supported by a substrate, depositing the electron blocking layer over the bulk heterojunction layer and depositing the anode over the bulk electron blocking layer.

The area of the OPD may be less than about 3 $cm^2$, less than about 2 $cm^2$, less than about 1 $cm^2$, less than about 0.75 $cm^2$, less than about 0.5 $cm^2$ or less than about 0.25 $cm^2$. The substrate may be, without limitation, a glass or plastic substrate. The substrate can be described as an inorganic semiconductor. In some embodiments, the substrate may be silicon. For example, the substrate can be a wafer of silicon. The substrate is transparent if, in use, incident light is to be transmitted through the substrate and the electrode supported by the substrate.

In some embodiments of the present disclosure, a method of manufacturing the organic photodetector may comprise: depositing a first formulation comprising the organic electron donor and the organic electron acceptor dissolved or dispersed in a first solvent or first solvent mixture over the cathode on the substrate to form a first wet film; drying the first wet film to provide the photoactive layer (bulk heterojunction layer) comprising the organic electron donor and the organic electron acceptor; depositing a second formulation comprising the electron blocking compound dissolved in a second solvent or second solvent mixture onto the photoactive layer to form a second wet film; drying the second wet film to provide the electron blocking layer; and forming the anode over the electron blocking layer. In some embodiments, the cathode is treated with polyethyleneimine (PEIE) prior to the deposition of the first formulation.

The bulk heterojunction layer may be formed by any process including, without limitation, thermal evaporation and solution deposition methods.

The first formulation may be deposited over the cathode. In some embodiments, the first formulation is deposited directly onto the surface of the cathode such that it is in contact with the cathode.

In some embodiments of the present disclosure, the first formulation comprising the acceptor material and the electron donor material is dissolved or dispersed in a first solvent or a first mixture of two or more solvents. The first formulation may be deposited by any coating or printing method including, without limitation, spin-coating, dip-coating, roll-coating, spray coating, doctor blade coating, wire bar coating, slit coating, ink jet printing, screen printing, gravure printing and flexographic printing.

The one or more solvents of the first formulation may optionally comprise or consist of benzene substituted with one or more substituents selected from chlorine, $C_{1-10}$ alkyl and $C_{1-10}$ alkoxy wherein two or more substituents may be linked to form a ring which may be unsubstituted or substituted with one or more $C_{1-6}$ alkyl groups, optionally toluene, xylenes, trimethylbenzenes, trimethoxybenzenes, tetramethylbenzenes, anisole, indane and its alkyl-substituted derivatives, and tetralin and its alkyl-substituted derivatives. In some embodiments, the solvent of the first formulation is 1,3,5-trimethoxybenzene, 1,2,3-trimethoxybenzene or 1,2,4-trimethoxybezene. In some embodiments, the solvent of the first formulation is 1,3,5-trimethoxybenzene.

The first formulation may comprise further components in addition to the electron acceptor, the electron donor and the one or more first solvents. As examples of such components, adhesive agents, defoaming agents, deaerators, viscosity enhancers, diluents, auxiliaries, flow improvers colourants, dyes or pigments, sensitizers, stabilizers, nanoparticles, surface-active compounds, lubricating agents, wetting agents, dispersing agents and inhibitors may be mentioned.

After the first formulation has been deposited over the cathode, it forms a first wet film. The first wet film is dried provide the photoactive layer (bulk heterojunction layer) comprising the organic electron donor and the organic electron acceptor. The first wet film may be dried by any suitable method. For example, in some embodiments, after the wet film has been formed, it may be left to dry and ambient temperature and pressure. Alternatively, the first wet film may be dried by active means, e.g. by subjecting it to conditions of increased heat and/or reduced pressure.

In some embodiments, the electron blocking layer may be introduced by depositing a second formulation comprising the electron blocking compound dissolved in a second solvent or second solvent mixture onto the photoactive layer to form a second wet film. In some embodiments, substantially all of the first solvent has been evaporated prior to the introduction of the second formulation.

The electron blocking layer may be formed by any process including, without limitation, thermal evaporation and solution deposition method.

In some embodiments, the second formulation is deposited directly onto the photoactive layer. This means that the second formulation is deposited directly onto the surface of the photoactive layer, such that it is in direct contact with the photoactive layer.

As mentioned, the second formulation comprises an electron blocking compound dissolved or dispersed in a second solvent or a second mixture of two or more solvents. The second formulation may be deposited by any coating or printing method including, without limitation, spin-coating, dip-coating, roll-coating, spray coating, doctor blade coating, wire bar coating, slit coating, ink jet printing, screen printing, gravure printing and flexographic printing. In some embodiments, the second formulation may be deposited by spin-coating.

In some embodiments, the second solvent comprises or consists of an aqueous ammonia solution. In some embodiments of the present disclosure, the electron blocking compound consists of copper thiocyanate and the second solvent consists of an aqueous ammonia solution. The inventors have found that the use of aqueous ammonia leads to the effective dissolution of copper thiocyanate so that it can be deposited onto the photoactive layer, but does not lead to the dissolution of the photoactive layer during this deposition.

After the second formulation has been deposited onto the photoactive layer it forms a second wet film. The second wet film may be dried by any suitable method. For example, in some embodiments, after the second wet film has been formed, it may be left to dry and ambient temperature and pressure. Alternatively, the first wet film may be dried by active means, e.g. by subjecting it to conditions of increased heat and/or reduced pressure.

After the formation of the electron blocking layer, the anode is formed over the electron blocking layer. In some embodiments, the electron-blocking layer is in direct contact with the anode. The anode may be deposited by any coating or printing method including, without limitation, spin-coating, dip-coating, roll-coating, spray coating, doctor blade coating, wire bar coating, slit coating, ink jet printing, screen printing, gravure printing and flexographic printing. In some embodiments of the present disclosure, the second formulation may be deposited by spin-coating.

The anode may be deposited from an anode formulation comprising or consisting of the material or materials of the anode dissolved or dispersed in one or more liquid materials. In some embodiments, the liquid material is water, or the liquid materials comprise water and one or more water-miscible liquid materials, optionally one or more protic or aprotic organic liquid materials, optionally DMSO. The anode formulation may comprise a surfactant. The surfactant may be a non-ionic or ionic surfactant. The surfactant may be a fluorinated surfactant.

The organic photodetector as described herein may be used in a wide range of applications including, without limitation, detecting the presence and/or brightness of ambient light and in a sensor comprising the organic photodetector and a light source. The photodetector may be configured such that light emitted from the light source is incident on the photodetector and changes in wavelength and/or brightness of the light may be detected. The sensor may be, without limitation, a gas sensor, a biosensor, an X-ray imaging device, a motion sensor (for example for use in security applications) a proximity sensor or a fingerprint sensor. The photodetector may be form part of a 1D or 2D array in an image sensor. For example, the photodetector may be part of an array of photodetectors in a camera image sensor.

Comparative Device 1

A device having the following structure was prepared:

Cathode/Donor: Acceptor layer/Anode

A glass substrate coated with a layer of indium-tin oxide (ITO) was treated with polyethyleneimine (PEIE) to modify the work function of the ITO.

A bulk heterojunction layer of a mixture of Donor Polymer 1 and acceptor compound C70IPH was deposited over the modified ITO layer by bar coating from 1,2,4-trimethylbenzene:benzyl benzoate in a donor:acceptor mass ratio of 1:1.7.

An anode (Clevios HIL-E100) available from Heraeus was formed over the donor/acceptor mixture layer by spin-coating.

Donor Polymer 1 has the structure:

Example 1

Devices were formed as described for Comparative Device 1, except that an electron blocking layer was disposed between the photoactive layer and the anode. The electron blocking layer (copper thiocyanate) was deposited over the bulk heterojunction layer by spin-coating prior to the anode being deposited directly onto the electron blocking layer, also by spin-coating. The thickness of the electron blocking layer was about 5 nm.

Figure 2:
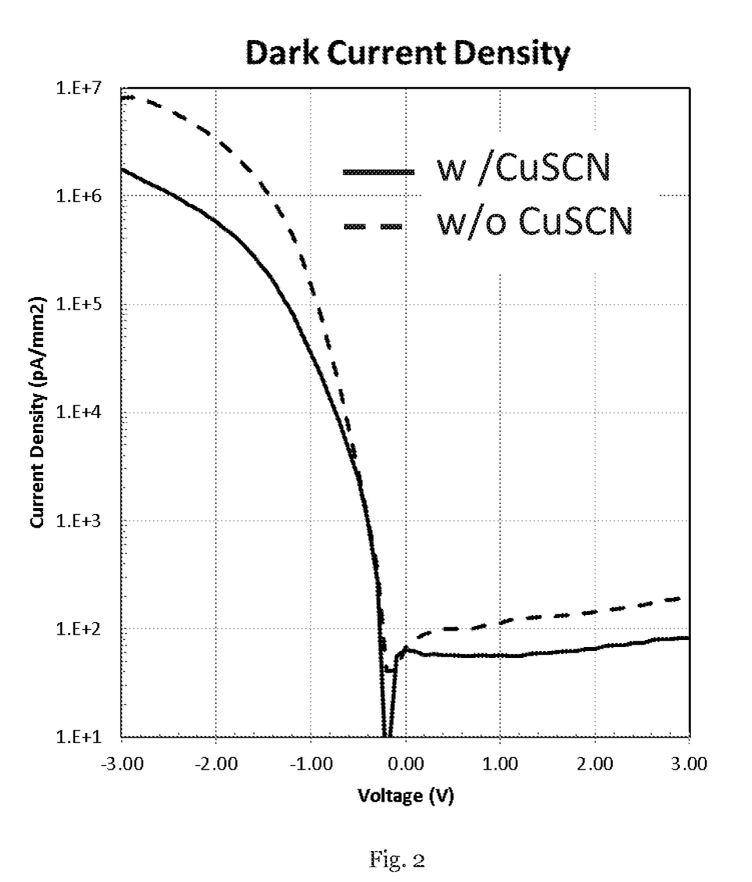
FIG. 2 is a graph of current density versus applied voltage for an OPD, according to some embodiments of the present disclosure, in dark conditions and a comparative OPD in the same conditions.

With reference to FIG. 2, it can be seen that dark current is considerably higher for Comparative Device 1 compared with devices of Example 1, which comprises an electron blocking layer, in accordance with some embodiments of the present disclosure.

External quantum efficiencies (EQE) of the devices made according to Example 1 were measured in reverse bias (2V). EQE indicates the amount of current that the OPD produces when irradiated by photons.

Figure 3:
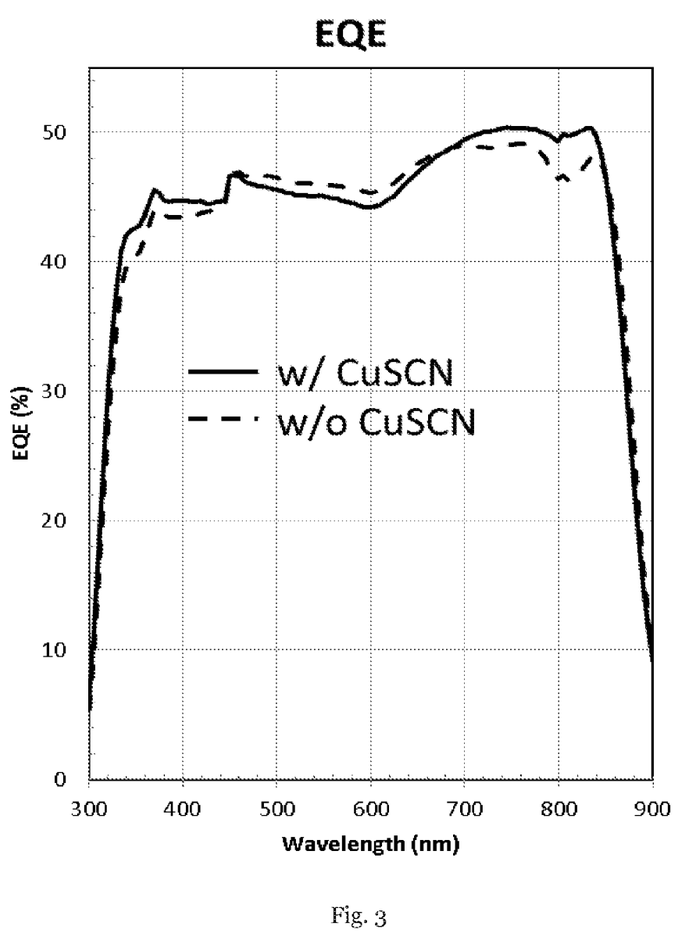
FIG. 3 is a graph of external quantum efficiency (EQE) versus wavelength for an OPD, according to some embodiments of the present disclosure, and a comparative OPD without the electron blocking material as described herein.

With reference to FIG. 3, the EQE for the device comprising the electron blocking layer is very close to the EQE achieved for the comparative device.

When the dark current and EQE measurements for Example 1 are considered together, it will be appreciated that, overall, the devices of Example 1 exhibit an improved signal-to-noise ratio compared with Comparative Device 1.

A further device was formed according to Example 1, except that the electron blocking layer had a thickness of about 15 nm. This device also provided reduced dark current and EQE relative to the device of the Comparative Example.

Although the present disclosure has been described in terms of specific exemplary embodiments, it will be appreciated that various modifications, alterations and/or combinations of features disclosed herein will be apparent to those skilled in the art without departing from the scope of the disclosure as set forth in the following claims.

What is claimed is:

1. A method of manufacturing an organic photodetector, the method comprising:
    depositing a first formulation on a substrate to form a first wet film over a cathode, wherein the cathode is coupled with the substrate and the first formulation comprises an organic electron donor and an organic electron acceptor dissolved in a first solvent or a first solvent mixture;
    drying the first wet film to provide a photoactive layer comprising the organic electron donor and the organic electron acceptor;
    depositing a second formulation onto the photoactive layer to form a second wet film, wherein the second formulation comprises an electron blocking compound dissolved in a second solvent or a second solvent mixture, wherein the second solvent or solvent mixture is configured to provide that the second solvent or solvent mixture does not dissolve the photoactive layer, and the electron blocking compound comprises a compound having a formula according to General Formula (I):

$$[M]^{a+}[X]_a^- \qquad \text{(General Formula (I))}$$

where M is a metal; X is CN, SCN, SeCN or TeCN; and a is at least 1;
    drying the second wet film to provide the electron blocking layer;
    forming the anode over the electron blocking layer;
    drying the second wet film to provide an electron blocking layer comprising the electron blocking compound;
    forming an anode over the electron blocking layer; and
    connecting the organic photodetector to a voltage source configured to apply a reverse bias to the organic photodetector.

2. The method according to claim 1, wherein the second solvent or solvent mixture comprises aqueous ammonia.

3. The method according to claim 1, wherein the first solvent or solvent mixture comprises 1,3,5-trimethoxybenzene.

4. The method according to claim 1, wherein the electron blocking compound comprises or consists of copper thiocyanate.

5. An organic photodetector manufactured according to the method according to claim 1.

6. A sensor comprising a light source and an organic photodetector according to claim 5.

7. A process of detecting light or measuring light intensity comprising measuring a photocurrent generated by an organic photodetector according to claim 5.

8. A method of manufacturing an organic photodetector, the method comprising:
    depositing a first formulation on a substrate to form a first wet film over a cathode, wherein the cathode is coupled with the substrate and the first formulation comprises an organic electron donor and an organic electron acceptor dissolved in a first solvent or a first solvent mixture;
    drying the first wet film to provide a photoactive layer comprising the organic electron donor and the organic electron acceptor;
    depositing a second formulation onto the photoactive layer to form a second wet film, wherein the second formulation comprises an electron blocking compound dissolved in a second solvent or a second solvent mixture, wherein the second solvent or solvent mixture comprises aqueous ammonia, and the electron blocking compound comprises a compound having a formula according to General Formula (I):

$$[M]^{a+}[X]_a^- \qquad \text{(General Formula (I))}$$

where M is a metal; X is CN, SCN, SeCN or TeCN; and a is at least 1;
    drying the second wet film to provide the electron blocking layer;
    forming the anode over the electron blocking layer;
    drying the second wet film to provide an electron blocking layer comprising the electron blocking compound;
    forming an anode over the electron blocking layer; and
    connecting the organic photodetector to a voltage source configured to apply a reverse bias to the organic photodetector.

9. The method according to claim 8, wherein the first solvent or solvent mixture comprises 1,3,5-trimethoxybenzene.

10. The method according to claim 8, wherein the electron blocking compound comprises or consists of copper thiocyanate.

11. An organic photodetector manufactured according to the method according to claim 8.

12. A sensor comprising a light source and an organic photodetector according to claim 11.

13. A process of detecting light or measuring light intensity comprising measuring a photocurrent generated by an organic photodetector according to claim 11.

14. A method of manufacturing an organic photodetector, the method comprising:
depositing a first formulation on a substrate to form a first wet film over a cathode, wherein the cathode is coupled with the substrate and the first formulation comprises an organic electron donor and an organic electron acceptor dissolved in a first solvent or a first solvent mixture, wherein the first solvent or solvent mixture comprises 1,3,5-trimethoxybenzene;
drying the first wet film to provide a photoactive layer comprising the organic electron donor and the organic electron acceptor;
depositing a second formulation onto the photoactive layer to form a second wet film, wherein the second formulation comprises an electron blocking compound dissolved in a second solvent or a second solvent mixture and the electron blocking compound comprises a compound having a formula according to General Formula (I):

$$[M]^{a+}[X]_a^-$$ (General Formula (I))

where M is a metal; X is CN, SCN, SeCN or TeCN; and a is at least 1;
drying the second wet film to provide the electron blocking layer;
forming the anode over the electron blocking layer;
drying the second wet film to provide an electron blocking layer comprising the electron blocking compound;
forming an anode over the electron blocking layer; and
connecting the organic photodetector to a voltage source configured to apply a reverse bias to the organic photodetector.

15. The method according to claim 14, wherein the electron blocking compound comprises or consists of copper thiocyanate.

16. An organic photodetector manufactured according to the method according to claim 14.

17. A sensor comprising a light source and an organic photodetector according to claim 16.

18. A process of detecting light or measuring light intensity comprising measuring a photocurrent generated by an organic photodetector according to claim 16.

* * * * *